(12) United States Patent
Menard

(10) Patent No.: US 8,785,970 B2
(45) Date of Patent: Jul. 22, 2014

(54) HF-CONTROLLED BIDIRECTIONAL SWITCH

(75) Inventor: Samuel Menard, Tours (FR)

(73) Assignee: STMicroelectronics (TOURS) SAS, Tours (FR)

( * ) Notice: Subject to any disclaimer, the term of this patent is extended or adjusted under 35 U.S.C. 154(b) by 276 days.

(21) Appl. No.: 13/104,254

(22) Filed: May 10, 2011

(65) Prior Publication Data

US 2011/0284921 A1 Nov. 24, 2011

(30) Foreign Application Priority Data

May 18, 2010 (FR) ...................................... 10 53823

(51) Int. Cl.
*H01L 29/66* (2006.01)

(52) U.S. Cl.
USPC ............ 257/155; 257/156; 257/119; 257/473

(58) Field of Classification Search
USPC .................. 257/155, 156, 473, 119
See application file for complete search history.

(56) References Cited

U.S. PATENT DOCUMENTS

| 3,958,268 | A | 5/1976 | Kamei et al. |
| 4,994,885 | A | 2/1991 | Yoshizawa |
| 6,034,381 | A | 3/2000 | Pezzani |
| 6,552,370 | B2 | 4/2003 | Pezzani |
| 6,593,600 | B1 | 7/2003 | Duclos et al. |
| 6,927,427 | B2 | 8/2005 | Ladiray |
| 6,933,541 | B1 * | 8/2005 | Huang .......................... 257/177 |
| 7,612,387 | B2 | 11/2009 | Mauriac et al. |
| 2006/0125055 | A1 * | 6/2006 | Menard ......................... 257/607 |
| 2007/0145408 | A1 * | 6/2007 | Menard ......................... 257/107 |

* cited by examiner

*Primary Examiner* — Jae Lee
(74) *Attorney, Agent, or Firm* — The Noblitt Group, PLLC

(57) ABSTRACT

A bidirectional switch controllable by a voltage between its gate and rear electrode and including an N-type semiconductor substrate surrounded with a P-type well; on the front surface side, a P-type well in which is formed a first N-type region; on the rear surface side, a P-type layer in which is formed a second N-type region. The well is doped to less than $10^{16}$ at./cm$^3$, the exposed surfaces of this well being heavily P-type doped. At least a third P-type region, of same doping level as the well, is formed on the front surface side in the substrate, and contains at least a fourth N-type region of a doping level lower than $10^{17}$ at./cm$^3$, on which is formed a Schottky contact.

7 Claims, 3 Drawing Sheets

HF-CONTROLLED BIDIRECTIONAL SWITCH

BACKGROUND OF THE INVENTION

1. Field of the Invention

The present invention relates to a vertical bidirectional power switch controlled by high-frequency signals (HF).

2. Discussion of Prior Art

Among switches intended to switch high voltages, and especially to switch loads connected to the mains voltage, vertical switches with four semiconductor layers of alternate conductivity types, generally designated as SCRs (Silicon Controlled Rectifiers), are essentially used. Among SCR switches, the most current are thyristors, which are unidirectional switches, and triacs, which are bidirectional switches. A conventional triac is formed of a semiconductor chip having its rear surface covered with a single metallization corresponding to a first main electrode and having its front surface covered with a metallization corresponding to a second main electrode and with a metallization to which a control terminal or gate is connected. A disadvantage of conventional triacs is that, for the control, a signal which is referenced to the front surface electrode must be applied to the gate. Now, in practice, such components are assembled by welding of their rear surface to a radiator, and this radiator is generally grounded. However, an A.C. voltage, for example, the mains voltage, is present on the front surface of the triac, and the control voltage must thus be applied in reference to a variable voltage. Since the control signal for example originates from an integrated circuit, this poses problems of isolation between this integrated circuit and the mains voltage.

Thus, the Applicant has created the concept of a bidirectional switch in which the control signal is referenced to the rear surface electrode. The Applicant sells this component under trademark "ACS" and has carried out many studies on such components. U.S. Pat. Nos. 6,034,381, 6,593,600, and 6,927,427 may especially be mentioned. For the sake of brevity, this type of switch will be called "rear surface reference switch" hereafter.

Further, the applicant has carried out many studies and implementations on the control of SCRs with high frequencies (HF or RF). This is the specific object of U.S. Pat. Nos. 6,862,196, 7,612,387, and patent application Ser. No. 11/643,444. These documents do not discuss rear surface reference switches, but rather thyristors and triacs. The various RF control systems of SCRs imply the use of one or several diodes having an electrode connected to a terminal of the SCR. Given that these diodes must let through high frequencies, it is preferable to use Schottky diodes, which are faster than bipolar diodes.

Of course, these diodes are desired to be integrated in the power component chip to avoid having to assemble a discrete diode. To this day, a solution has been found to perform this integration in the case where the SCR is a thyristor, as provided in above-mentioned U.S. Pat. No. 7,612,387.

SUMMARY OF THE INVENTION

An embodiment of the present invention aims at forming a rear surface reference switch adapted to a HF control and integrating at least one Schottky diode.

An embodiment of the present invention more specifically aims at performing such an integration which is easy to achieve and does not basically modify the masks and manufacturing steps used for the conventional manufacturing of a rear surface reference switch.

An embodiment of the present invention provides a bidirectional switch comprising, on its rear surface, a first main electrode and, on its front surface, a second main electrode and a gate electrode, this switch being controllable by a voltage between the gate and the first electrode, and comprising:

a semiconductor substrate (40) of a first conductivity type surrounded with a wall (53) of the second conductivity type, on the front surface side, a well (41) of the second conductivity type in substantially half of which is formed a first region (43) of the first conductivity type, on the rear surface side, a layer (42) of the second conductivity type in which is formed a second region (44) of the first conductivity type substantially in front of the well portion (41) which is not taken up by the first region (43), wherein said well and said layer are doped to a doping level lower than $10^{16}$ at./cm$^3$, the exposed external surfaces of this well and of this layer being heavily doped of the second conductivity type (45, 44), and wherein at least a third region (61) of the second conductivity type, of same doping level as said well and said layer, is formed on the front surface side in the substrate, the third region containing at least one fourth region (70, 71) of the first conductivity type of a doping level lower than $10^{17}$ at./cm$^3$, on which is formed a Schottky contact.

According to an embodiment of the present invention, each fourth region (70,71) further contains at least one heavily-doped contact area of the first conductivity type.

According to an embodiment of the present invention, a gate region of the first conductivity type is formed in a portion of the third region arranged in contact with said wall (53).

According to an embodiment of the present invention, the bidirectional component comprises, on the rear surface side, under the gate area, means (64, 65) for channeling the gate current towards the center of the component.

According to an embodiment of the present invention, a metallization connects the Schottky contact areas and the gate contact area.

According to an embodiment of the present invention, said metallization extends above the wall (53) and/or a region of the second conductivity type in contact with this wall to form a capacitor.

According to an embodiment of the present invention, the first conductivity type is type N.

The foregoing and other aspects of the present invention will be discussed in detail in the following non-limiting description of specific embodiments in connection with the accompanying drawings.

DETAILED DESCRIPTION

As usual in the representation of semiconductor components, the various drawings are not to scale.

Figure 1A:
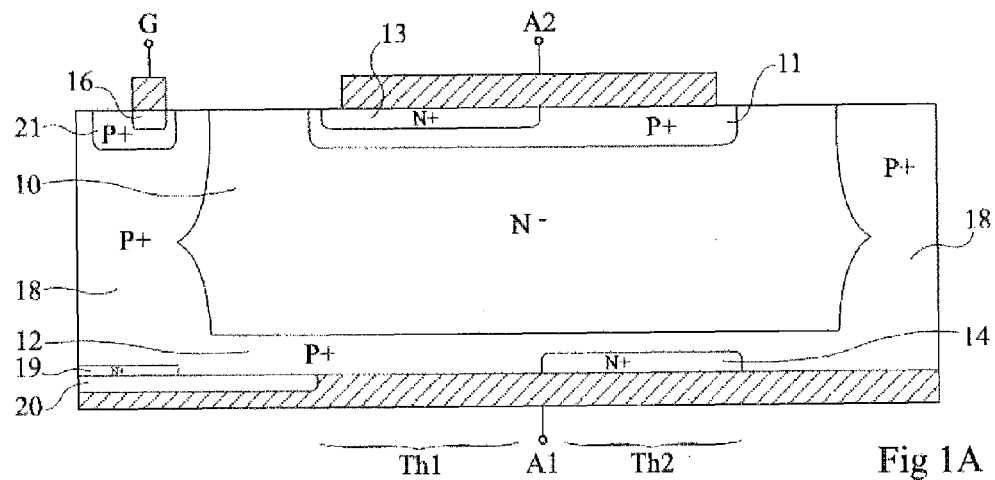
FIGS. 1A and 1B respectively are a simplified cross-section view and a top view of an example of a rear surface reference switch.
Figure 1B:
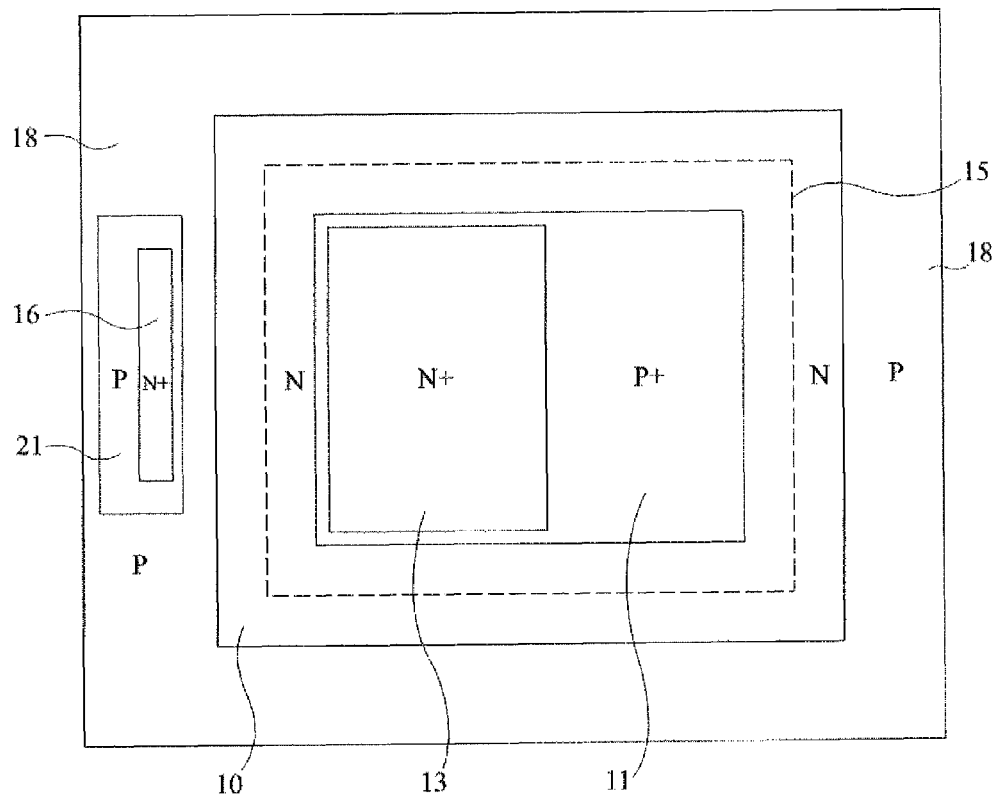

FIGS. 1A and 1B respectively are a simplified cross-section view and a top view of an example of a rear surface reference switch of the type described in above-mentioned U.S. patent application Ser. No. 11/643,444, now U.S. Pat. No. 7,718,473. This switch comprises a power portion comprising thyristors Th1 and Th2 in antiparallel. These two thyristors are formed in a structure comprising a lightly-doped N-type substrate 10. On the side of the lower (rear) and upper (front) surfaces are formed P-type layers, 11 and 12, layer 11 being on the front surface side and layer 12 being on the rear surface side. In region 11, on the left-hand side of the drawing, is formed an N-type region 13 so that a vertical NPNP thyristor Th1 is formed by region 13, layer 11, substrate 10, and layer 12. On the rear surface side is formed an N-type region 14 at least partly in front of the portion P-type region 11 where N region 13 is not formed. A vertical PNPN thyristor Th2 comprising regions and layers 11, 10, 12, and 14 is thus formed. An $N^+$-type channel stop ring surrounding the power portion has been symbolized by dashed lines 15. In this example of rear surface reference component, the gate is formed of an $N^+$-type region 16 formed on the front surface side of a peripheral wall 18 surrounding the entire bidirectional switch.

On the rear surface side under the wall portion containing gate portion 16, means such that, when a negative voltage with respect to rear surface electrode A1 is applied to gate terminal G, a current flows vertically inside of the wall from the gate to the rear surface, then is horizontally channeled into P layer 12 under a portion of substrate 10, are provided. The current channeling means comprise a heavily-doped N-type region 19 and an insulating layer portion 20. The flowing of this current causes the injection of electrons into substrate 10 and thus, the turning-on of that of the two thyristors Th1 and Th2 which is properly biased. An optional P-type layer portion 21 diffused at the same time as well 11 has also been shown under gate region 16. If provided, layer portion 21 must be less heavily doped than the upper portion of wall 18 to enhance the gain of the NPN gate transistor.

In this structure, well 11 and layer 12 are heavily P-type doped, to reach a surface concentration greater than $10^{18}$ at./cm$^3$ and to enable to obtain an ohmic contact on the exposed surfaces of regions 11 and 12.

Figure 2:
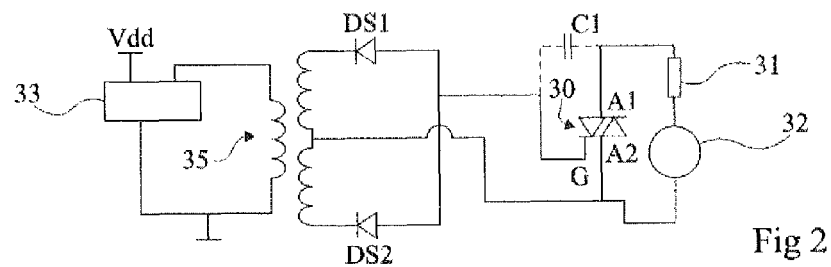
FIG. 2 shows an HF controlled circuit for a rear surface reference switch.

FIG. 2 shows a circuit adapted to the RF control of a rear surface reference switch. In this drawing, the rear surface reference switch is designated with reference numeral 30 and is connected between its main terminals to a load 31 and to an A.C. power supply source 32, which may for example be the mains voltage. A RF voltage is provided by an oscillator 33 connected between a high power supply VDD and the ground and supplying the primary of a transformer 35. The high and low points of the transformer are connected via Schottky diodes DS1 and DS2 to the gate of rear surface reference switch 30, and the midpoint of the transformer is connected to main electrode A2 of the switch. This is an example only of the RF excitation circuit of a rear surface reference switch, which has been given to illustrate the fact that there exists at least one Schottky diode connected to an electrode of the rear surface reference switch.

It is here desired to integrate at least one Schottky diode into the structure of a rear surface reference switch.

Figure 3A:
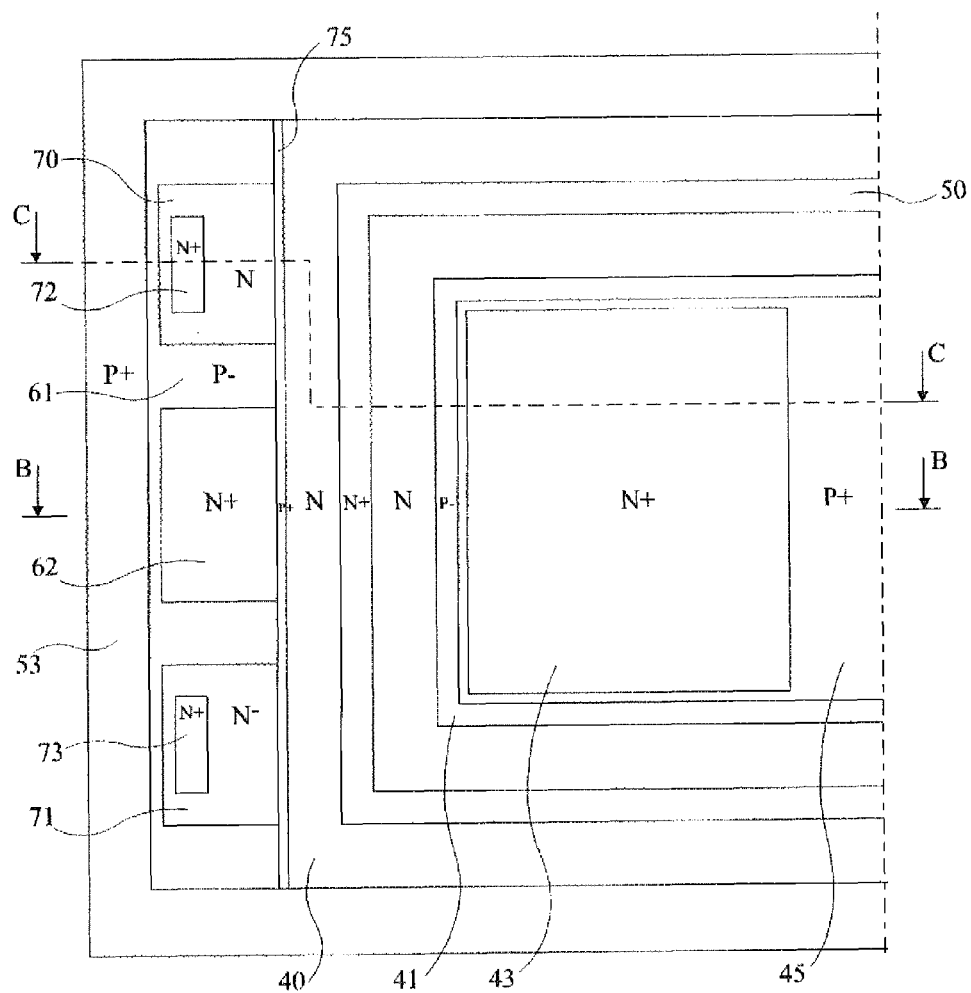
FIGS. 3A, 3B, and 3C respectively are a top view and simplified cross-section views of an example of a rear surface reference switch integrating two Schottky diodes.
Figure 3B:
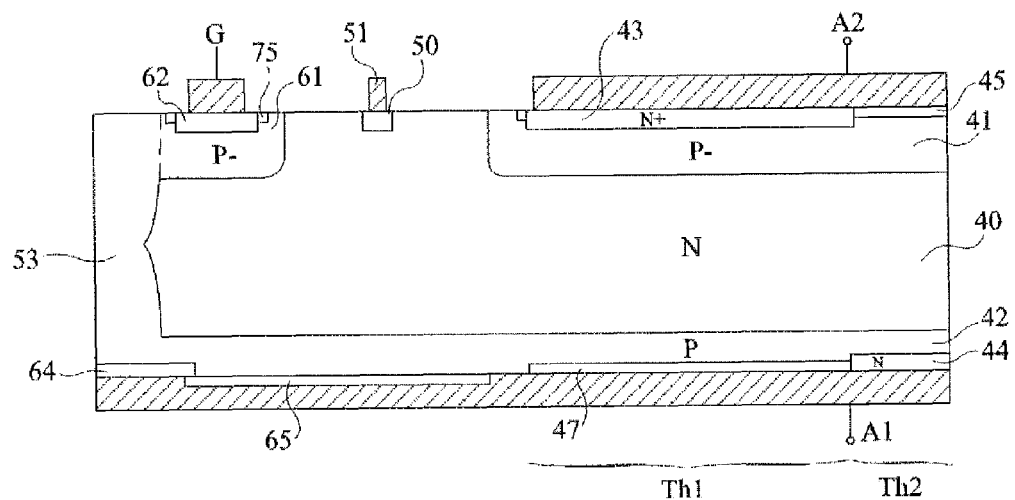
Figure 3C:
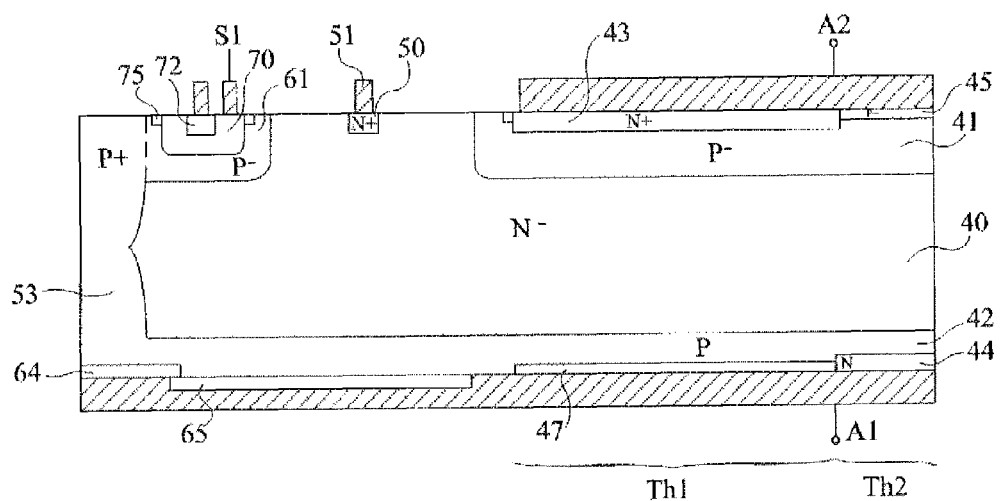

An example of such an integration is illustrated in FIGS. 3A, 3B, 3C. FIG. 3A is a top view of a portion of the rear surface reference switch (the right-hand portion, not shown, being similar to the right-hand portion of the switch of FIG. 1A). FIG. 3B is a cross-section view along line BB of FIG. 3A and FIG. 3C is a cross-section view along broken line CC of FIG. 3A.

FIGS. 3A and 3B show a power portion comprising two vertical thyristors in antiparallel Th1, Th2. The structure is formed from a substrate 40 which comprises, on the front surface side, a P-type well 41 and, on the rear surface side, a layer 42, also of type P. Well 41 and layer 42, preferably formed simultaneously, are very lightly doped, that is, with a doping level of $10^{15}$ or $10^{16}$ atoms/cm$^3$. A heavily-doped N-type region 43 ($N^+$) is formed in well 41 and a heavily-doped N-type region 44 substantially complementary to region 43 with respect to the projection of well 41 is formed in layer 42. In the apparent surface portions of well 43 and of layer 42, in the power portion, heavily-doped P-type regions, respectively 45 and 47, having a doping level greater than $10^{18}$ at./cm$^3$, are formed. A NPNP$^+$ thyristor Th1 43-41-40-42-47 and a P$^+$PNPN thyristor Th2 45-41-40-42-44 have thus been formed.

The power portion is preferably surrounded with a channel stop ring 50 topped with an unconnected metallization 51. The entire component is surrounded with a peripheral wall 53.

The control portion comprises a region 61, connected to peripheral wall 53, of same light P doping as well 41 and layer 42. In this region 61 is formed a heavily-doped N-type region 62 which corresponds to gate region 16 of FIG. 1B and on which a gate metallization G is formed. As previously, a heavily-doped N-type region 64 and an insulating layer 65 intended to channel the gate current are formed on the rear surface side. The entire rear surface is coated with a first main electrode metallization A1, a second main electrode metallization A2 covering N$^+$ and P$^+$ portions 43 and 45 on the front surface side. Thus, this device operates as a rear surface reference switch, like the structure of FIGS. 1A and 1B.

If FIG. 3A is more specifically considered in relation with the cross-section view of FIG. 3C, it should be noted that, above and under the gate regions, lightly-doped N-type regions 70 and 71 are formed in an extension of lightly-doped P-type region 61. Regions 70 and 71 may be lightly doped, given that region 61 has, like well 41 and layer 42, a doping level approximately ranging from $10^{15}$ to $10^{16}$ at./cm$^3$. N regions 70, 71 can thus have low doping level ranging from $10^{16}$ to $10^{17}$ at./cm$^3$ only. Thus, Schottky contacts S1 and S2 may be formed on these regions (Schottky contact S2 is not visible in the cross-section view). A second contact corresponding to the cathode of the Schottky diodes may be taken due to heavily-doped N-type regions 72 and 73 formed in N regions 70 and 71.

In the cross-section views of FIGS. 3B and 3C, the fact for the front surface of the component to be coated with an insulating layer, except at the locations where the metallizations are deposited has not been shown. To avoid for an inversion of the polarities of the lightly-doped P-type layers to occur, and to limit leakage currents, heavily-doped P-type regions 75 will preferably be provided around N region 70.

A component integrating a rear surface reference switch and Schottky diodes intended to transmit an RF signal to the gate have thus been obtained without adding an excessive number of steps and without substantially modifying the masks of the structure.

In the example of the electric circuit of FIG. 2, anodes S1 and S2 of the Schottky diodes will be connected to gate metallization G and each of N$^+$ cathode regions 72 and 73 of the Schottky diodes will be connected to an end terminal of the secondary of transformer 35.

Further, in such a component, it may be desirable to provide a capacitor (C1, see FIG. 2) between the gate terminal and terminal A1 of the component. This may be achieved by selecting an adapted configuration of the metallization of the two anodes of the Schottky diodes at the gate terminal, this metallization then extending above the upper surfaces of regions 61, 75, and/or 53 (not shown).

In the foregoing, an example has been provided by considering a specific structure of the rear surface reference switch control area. It is well known, and this especially appears in the prior patents and patents applications of the applicant, that various configurations of the control area may be provided. The present invention may be easily adapted by those skilled in the art to these other configurations.

Further, as an example, the following doping levels (Cs) and thicknesses (xj) may be selected for the different previously-described layers and regions:

well 41 and layer 42: xj=40 μm Cs=$10^{15}$ at./cm$^3$;
P$^+$ regions 45, 47, and 75: xj=5 μm Cs=$10^{19}$ at./cm$^3$;
N regions 70, 71: xj=20 μm Cs=$10^{16}$ at./cm$^3$;
N$^+$ regions 43, 44, 64: xj=10 μm Cs=$10^{20}$ at./cm$^3$;
substrate 30: thickness 210 μm, resistivity 33-39 Ω.cm.

Of course, these are specific examples only and it will be within the abilities of those skilled in the art to adapt these values to the specific needs of the component which is desired to be formed, while however noting that the wells must be lightly doped, to be able to form lightly-doped N regions at the locations where Schottky diodes are desired to be formed.

The present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A bidirectional switch comprising, on its rear surface, a first main electrode (A1) and, on its front surface, a second main electrode (A2) and a gate electrode (G), this switch being controllable by a voltage between the gate and the first electrode, and comprising:

a semiconductor substrate of a first conductivity type surrounded with a wall of the second conductivity type;
on the front surface side, a well of the second conductivity type in substantially half of which is formed a first region of the first conductivity type;
on the rear surface side, a layer of the second conductivity type in which is formed a second region of the first conductivity type substantially in front of a portion of said well which is not taken up by the first region;
wherein said well and said layer are doped with a doping level lower than $10^{16}$ at./cm$^3$, the exposed external surfaces of said well and of said layer being heavily doped of the second conductivity type; and
wherein at least a third region of the second conductivity type, of same doping level as said well and said layer, is formed on the front surface side in the substrate, the third region containing at least one fourth region of the first conductivity type of a doping level lower than $10^{17}$ at./cm$^3$, on which is formed a Schottky contact.

2. The bidirectional switch of claim 1, wherein each fourth region further includes at least one heavily-doped contact area of the first conductivity type.

3. The bidirectional switch of claim 1, wherein a gate region of the first conductivity type is formed in a portion of the third region arranged in contact with said wall.

4. The bidirectional switch of claim 3, comprising, on the rear surface side, under the gate area, means for channeling the gate current towards the center of the component.

5. The bidirectional switch of claim 3, wherein a metallization connects the Schottky contact areas and the gate contact area.

6. The bidirectional switch of claim 5, wherein said metallization extends above the wall and/or a region of the second conductivity type in contact with the wall to form a capacitor.

7. The bidirectional switch of claim 1, wherein the first conductivity type is type N.

* * * * *